United States Patent
Gmeinwieser

(10) Patent No.: US 11,367,817 B2
(45) Date of Patent: Jun. 21, 2022

(54) OPTOELECTRONIC COMPONENT INCLUDING A REFLECTIVE POTTING COMPOUND, AND ITS PRODUCTION METHOD

(71) Applicant: OSRAM OLED GmbH, Regensburg (DE)

(72) Inventor: Nikolaus Gmeinwieser, Donaustauf (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/982,661

(22) PCT Filed: Mar. 13, 2019

(86) PCT No.: PCT/EP2019/056219
§ 371 (c)(1),
(2) Date: Sep. 21, 2020

(87) PCT Pub. No.: WO2019/179834
PCT Pub. Date: Sep. 26, 2019

(65) Prior Publication Data
US 2021/0098667 A1    Apr. 1, 2021

(30) Foreign Application Priority Data
Mar. 23, 2018    (DE) ..................... 10 2018 106 972.3

(51) Int. Cl.
*H01L 33/60*    (2010.01)
*F21V 8/00*    (2006.01)
(Continued)

(52) U.S. Cl.
CPC ............ *H01L 33/60* (2013.01); *G02B 6/0073* (2013.01); *H01L 33/505* (2013.01); *H01L 33/54* (2013.01);
(Continued)

(58) Field of Classification Search
CPC ....... H01L 33/60; H01L 33/505; H01L 33/54; H01L 2933/0041; H01L 2933/005; H01L 2933/0058; H01L 33/486; G02B 6/0073
See application file for complete search history.

(56) References Cited

U.S. PATENT DOCUMENTS 7,196,354 B1    3/2007    Erchak et al.
9,470,839 B2 *    10/2016    Ye ........................ G02B 6/0073
(Continued)

FOREIGN PATENT DOCUMENTS

DE    10 2014 105 839 A1    10/2015
EP    2 854 186 A1    4/2015
(Continued)

*Primary Examiner* — Donald L Raleigh
(74) *Attorney, Agent, or Firm* — DLA Piper LLP (US)

(57) ABSTRACT

An optoelectronic component includes an optoelectronic semiconductor chip including a carrier substrate, a first and a second side surface facing one another, respectively, and a third and a fourth side surface that intersect the first and second side surfaces, and a first main surface, at which at least one contact area is arranged, the carrier substrate being transparent to the emitted electromagnetic radiation, a transparent first potting compound directly adjacent to the first side surface; and a reflective potting compound directly adjacent to the second side surface and the carrier substrate and applied directly to the semiconductor chip.

18 Claims, 17 Drawing Sheets

(51) Int. Cl.
*H01L 33/50* (2010.01)
*H01L 33/54* (2010.01)

(52) U.S. Cl.
CPC *H01L 2933/005* (2013.01); *H01L 2933/0041* (2013.01); *H01L 2933/0058* (2013.01)

(56) References Cited

U.S. PATENT DOCUMENTS

| | | | |
|---|---|---|---|
| 10,062,813 | B2 | 8/2018 | Herrmann et al. |
| 2013/0069102 | A1 | 3/2013 | Kimura et al. |
| 2014/0021493 | A1* | 1/2014 | Andrews ................. H01L 33/60 257/88 |
| 2014/0061705 | A1* | 3/2014 | Tischler ................. H05B 33/12 257/98 |
| 2014/0153238 | A1* | 6/2014 | Nishimura .......... H01L 25/0753 362/237 |
| 2016/0351550 | A1* | 12/2016 | Sabathil ................ H01L 31/143 |
| 2017/0222106 | A1 | 8/2017 | Nakabayashi |

FOREIGN PATENT DOCUMENTS

| | | |
|---|---|---|
| EP | 2 874 190 A1 | 5/2015 |
| WO | 2017/062119 A1 | 4/2017 |

\* cited by examiner

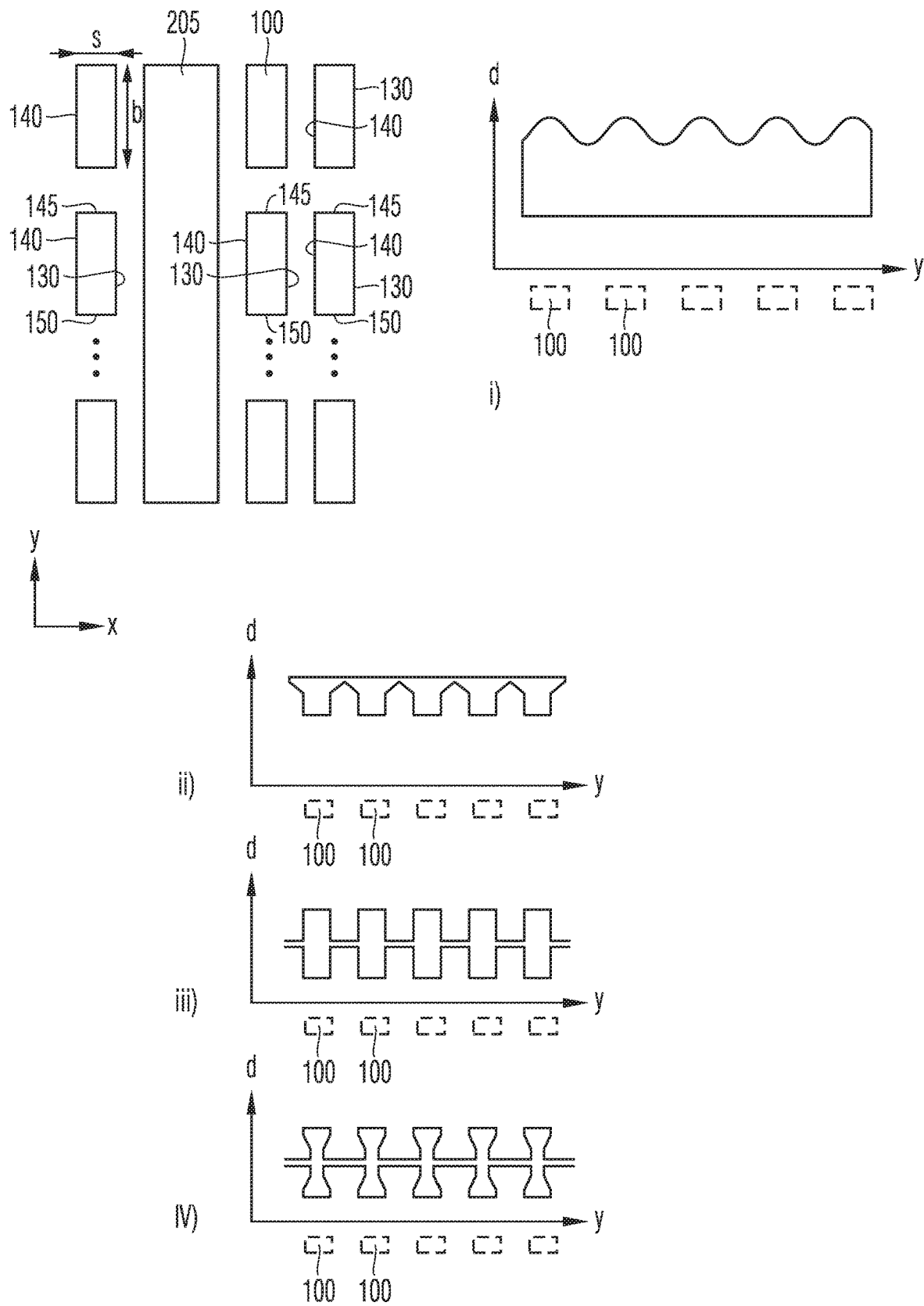

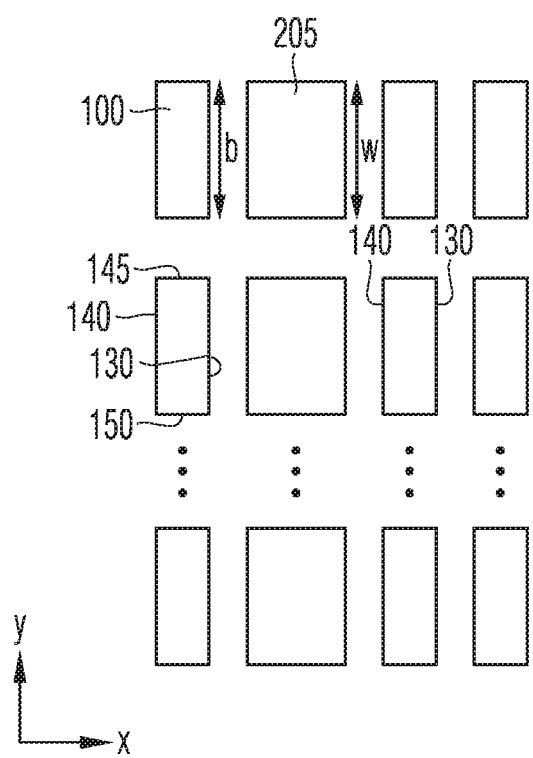

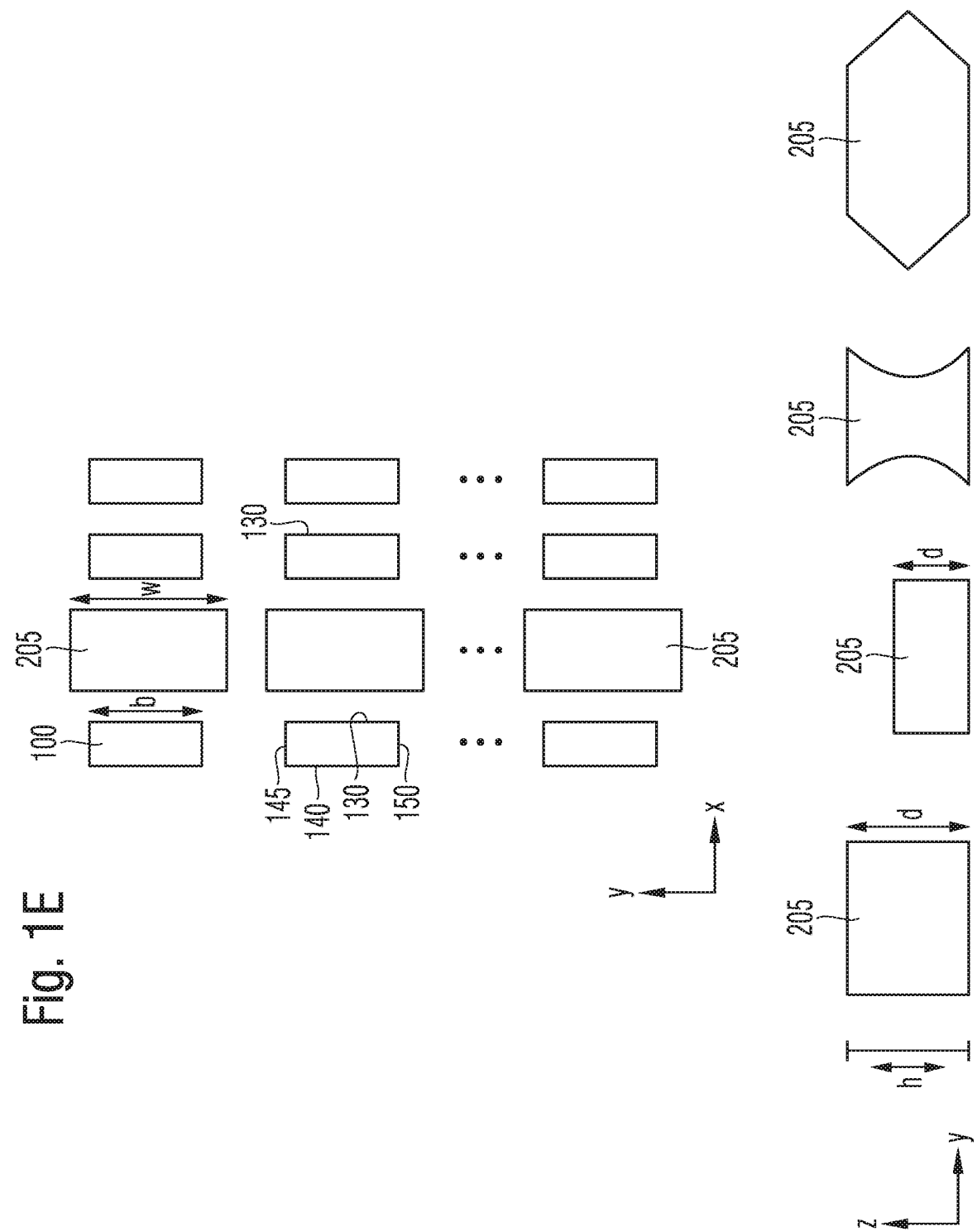

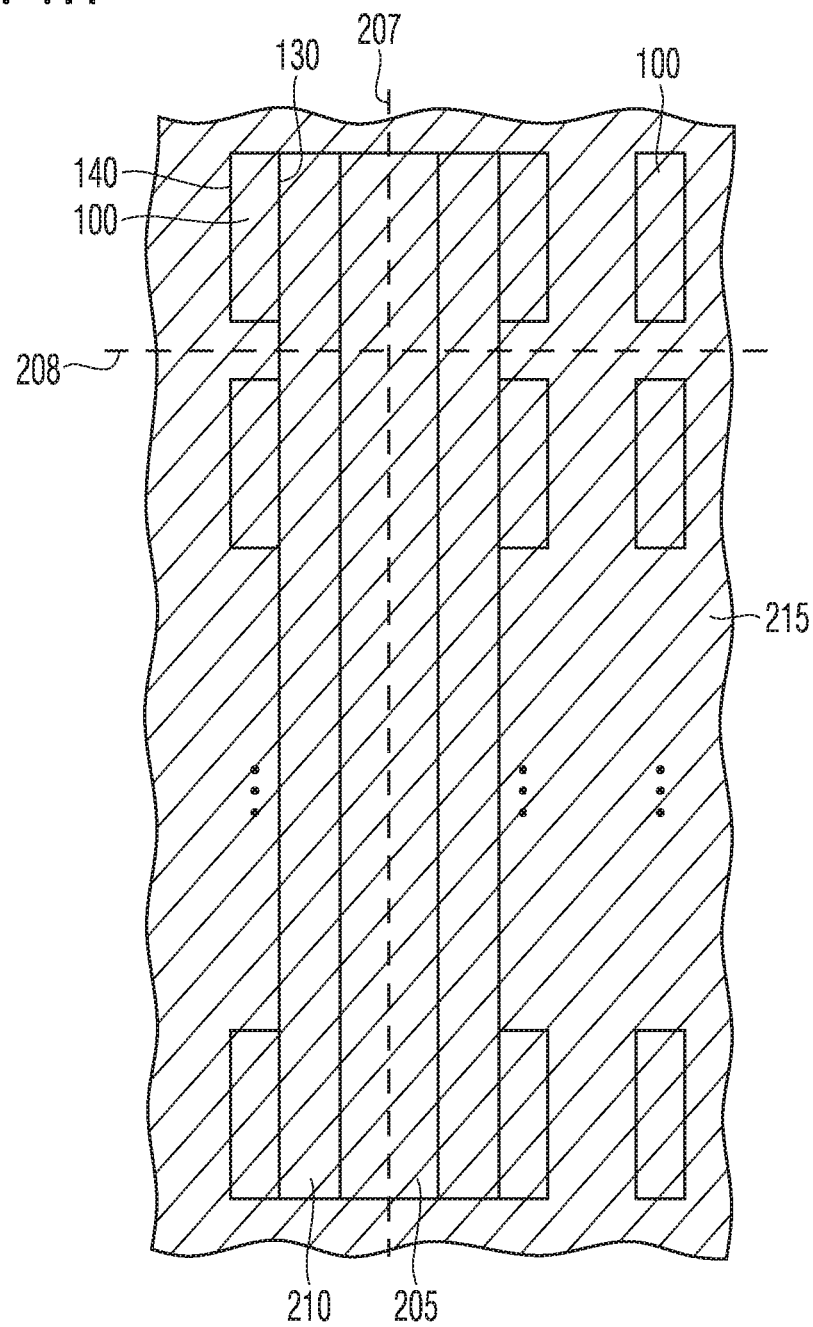

OPTOELECTRONIC COMPONENT INCLUDING A REFLECTIVE POTTING COMPOUND, AND ITS PRODUCTION METHOD

TECHNICAL FIELD

This disclosure relates to an optoelectronic component including a reflective potting compound and a method of producing the compound.

BACKGROUND

Optoelectronic components that emit light in a direction parallel to a substrate surface of the light-emitting semiconductor chip are widely used in conjunction with a planar optical waveguide, for example, to illuminate display devices. Such optoelectronic components that emit light in a direction parallel to the substrate surface are also referred to as Sidelooker components.

There is a need to produce such Sidelooker components having a reduced area requirement. It could therefore be helpful to provide an improved optoelectronic semiconductor component and an improved method of producing an optoelectronic semiconductor component.

SUMMARY

My optoelectronic component comprises an optoelectronic semiconductor chip comprising a first and a second side surface, respectively, that are facing one another, and also a third and a fourth side surface, that intersect the first and second side surfaces, and a first main surface, at which at least one contact area is arranged. The optoelectronic component furthermore comprises a first potting compound directly adjacent to the first side surface, and a reflective potting compound directly adjacent to the second side surface.

In addition, the reflective potting compound may at least partly adjoin the third and fourth side surfaces and also a second main surface, respectively. By way of example, in places a part of the first potting compound may be present between parts of the third or fourth side surface and the reflective potting compound. Furthermore, a part of the first potting compound may be arranged between a part of the second main surface and the reflective potting compound. Moreover, a suitable intermediate layer may be arranged between the third or fourth side surface and the reflective potting compound or between the second main surface and the reflective potting compound.

By way of example, the reflective potting compound may furthermore adjoin a region between second side surface and contact area. In this example, the reflective potting compound may adjoin a part of the first main surface. By way of example, the reflective potting compound may adjoin that part of the first main surface at which no contact area is present.

The first potting compound may comprise a converter material. The first potting compound may be transparent.

The optoelectronic component may comprise a converter element on the side of the first side surface, wherein the first potting compound is arranged between first side surface and converter element.

A height of the converter element may be greater than a height of the optoelectronic semiconductor chip, wherein the height of the semiconductor chip is measured perpendicular to the first main surface. By setting the size of the converter element, that is to say, for example, the height and the width, it is possible to set the emission characteristic of the optoelectronic component.

The optoelectronic component is suitable for emitting electromagnetic radiation in a direction perpendicular to the first side surface. The optoelectronic component thus constitutes a Sidelooker component.

My method of producing optoelectronic components comprises arranging optoelectronic semiconductor chips comprising a first and a second side surface, respectively, that are facing one another, and also a third and a fourth side surface, that intersect the first and second side surfaces, and a first main surface, at which at least one contact area is arranged, respectively, on a carrier such that the first main surface is positioned adjacent to the carrier, respectively. A first potting compound is introduced between adjacent semiconductor chips such that the first potting compound is directly adjacent to the first side surface, respectively. A reflective potting compound is applied such that the reflective potting compound is directly adjacent to the second side surface. Afterward, the optoelectronic components are singulated such that each optoelectronic component comprises at least one optoelectronic semiconductor chip.

By way of example, the reflective potting compound may additionally at least partly adjoin the third or fourth side surface and also a second main surface, respectively.

The method may furthermore comprise introducing converter elements on the side of the first side surface, respectively, wherein the first potting compound is introduced between converter element and first side surface.

By way of example, the converter element may be introduced before the first potting compound is introduced. The converter element may also be introduced after or at the same time as the first potting compound is introduced.

Before introducing the first potting compound, a reflective prepotting compound may furthermore be introduced to be directly adjacent to the second side surface.

Before the first potting compound is introduced, an intermediate layer may be introduced between first side surfaces of adjacent semiconductor chips. By way of example, the position of the intermediate layer may define a position at which the individual optoelectronic components will be singulated.

At least two converter elements may be introduced between two optoelectronic semi-conductor chips. The singulating may be carried out between the at least two converter elements. By way of example, an intermediate layer may be introduced between two converter elements.

An electrical device may contain the optoelectronic component as defined above. By way of example, the electrical device may furthermore comprise an optical waveguide. The light emitted by the optoelectronic component may be passed on by the optical waveguide to form a two-dimensional illumination element. The electrical device may be a mobile communication device or a display device.

BRIEF DESCRIPTION OF THE DRAWINGS

The accompanying drawings provide an understanding of examples of my components and methods. The drawings illustrate examples and, together with the description, explain them. Further examples and numerous of the intended advantages are evident directly from the following detailed description. The elements and structures shown in the drawings are not necessarily illustrated in a manner true

FIGS. 1C to 1E show schematic plan views of elements of optoelectronic components when carrying out the method in accordance with one or more examples.

FIGS. 1H to 1J show schematic horizontal cross-sectional views of elements of optoelectronic components when carrying out the method in accordance with one or more examples.

LIST OF REFERENCE SIGNS

Figure 1A:
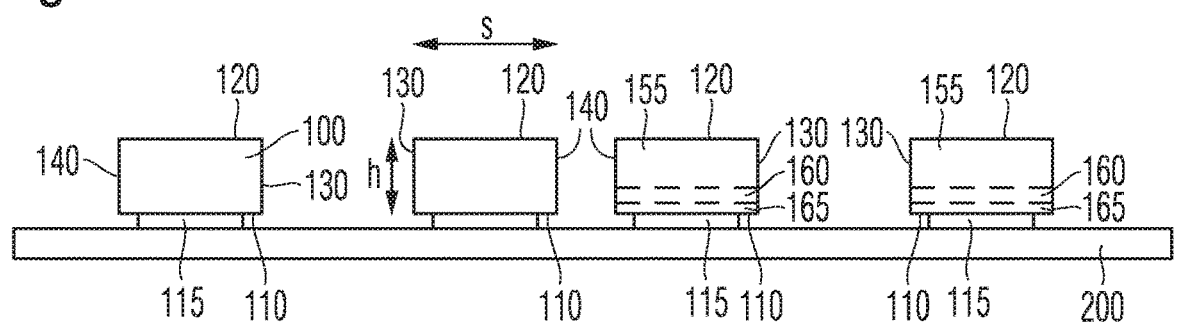
FIGS. 1A and 1B show schematic cross-sectional views of elements of an optoelectronic component when carrying out the method in accordance with one or more examples.

10 Optoelectronic component
11 First side surface of the component (emission surface)
12 First main surface of the component
15 Electromagnetic radiation
20 Electrical device
25 Optical waveguide
100 Optoelectronic semiconductor chip
110 First main surface
115 Contact area
120 Second main surface
130 First side surface
140 Second side surface
145 Third side surface
150 Fourth side surface
155 Carrier substrate
160 First optoelectronically active layer
165 Second optoelectronically active layer
200 Carrier
205 Converter element
206 Converter element
207 Separating line
208 Separating line
210 Transparent potting compound
212 Intermediate layer
215 Reflective potting compound
217 Reflective prepotting compound
218 Interface
220 Converter-containing potting compound
221 Reflective material
222 Reflective material

DETAILED DESCRIPTION

In the following detailed description, reference is made to the accompanying drawings, which form part of the disclosure and show specific examples for illustration purposes. In this context, a direction terminology such as "top," "bottom," "front," "back," "leading," "trailing" and the like is referenced relative to the orientation of the Figures currently being described. Since the elements of the examples may be positioned in different orientations, the direction terminology serves only for explanation and is not restrictive in any way.

The description of the examples is not restrictive since other examples also exist and structural or logical changes may be made, without deviating from the scope defined by the claims. In particular, elements of examples described below may be combined with elements of other examples from among those described, unless the context indicates otherwise.

The terms "wafer" or "semiconductor substrate" used in the following description may comprise any semiconductor-based structure having a semiconductor surface. Wafer and structure should be understood to include doped and undoped semiconductors, epitaxial semiconductor layers, supported by a base semiconductor foundation, and further semiconductor structures. By way of example, a layer composed of a first semiconductor material may be grown on a growth substrate composed of a second semiconductor material. The layer composed of a first semiconductor material may also be grown on an insulating substrate, for example, a sapphire substrate. Depending on the purpose of use, the semiconductor may be based on a direct or an indirect semiconductor material. Examples of semiconductor materials that are particularly suitable for generating electromagnetic radiation comprise in particular nitride semiconductor compounds, which may generate ultraviolet light, blue light or light of a longer wavelength, for example, such as, for example, GaN, InGaN, AlN, AlGaN, AlGaInN, phosphide semiconductor compounds, that may generate green light or light of a longer wavelength, for example, such as, for example, GaAsP, AlGaInP, GaP, AlGaP, and also further semiconductor materials such as AlGaAs, SiC, ZnSe, GaAs, ZnO, $Ga_2O_3$, diamond, hexagonal BN and combinations of these materials. The stoichiometric ratio of the ternary compounds may vary. Further examples of semiconductor materials may comprise silicon, silicon-germanium and germanium. The term "semiconductor" also includes organic semiconductor materials.

The wavelength of electromagnetic radiation emitted by an LED chip may usually be converted using a converter material containing a phosphor. By way of example, white light may be generated by a combination of an LED chip that emits blue light with a suitable phosphor. By way of example, the phosphor may be a yellow phosphor that, when being excited by the light from the blue LED chip, is suitable to emit yellow light. The phosphor may absorb, for example, part of the electromagnetic radiation emitted by the LED chip. The combination of blue and yellow light is perceived as white light. By admixing further phosphors suitable for emitting light of a further wavelength, for example, of a red wavelength, it is possible to change the color temperature. In accordance with further examples, white light may be generated by a combination comprising a blue LED chip and a green and red phosphor. A converter material may comprise a plurality of different phosphors, each emitting a different wavelength.

Examples of phosphors are metal oxides, metal halides, metal sulfides, metal nitrides and the like. These compounds may furthermore contain additives that result in specific wavelengths being emitted. By way of example, the additives may comprise rare earth materials. As an example of a yellow phosphor, YAG:$Ce^{3+}$ (cerium-activated yttrium aluminum garnet ($Y_3Al_5O_{12}$)) or $(Sr_{1.7}Ba_{0.2}Eu_{0.1})SiO_4$ may be used. Further phosphors may be based on $MSiO_4$:$Eu^{2+}$, wherein M may be Ca, Sr or Ba. A desired conversion wavelength may be selected by selecting the cations with an appropriate concentration. Many further examples of suitable phosphors are known.

In accordance with applications, the phosphor material, for example, a phosphor powder, may be embedded into a suitable matrix material. By way of example, the matrix material may comprise a resin or polymer composition such as a silicone resin or an epoxy resin, for example. The size of the phosphor particles may be in a micrometer or nanometer range, for example.

The matrix material may comprise a glass. By way of example, the converter material may be formed by sintering the glass, for example, $SiO_2$ with further additives and phosphor powder to form a phosphor in glass (PiG).

The phosphor material itself may be sintered to form a ceramic. By way of example, as a result of the sintering process, the ceramic phosphor may have a polycrystalline structure.

The phosphor material may be grown to form a monocrystalline phosphor, for example, using the Czochralski (Cz) method.

The phosphor material itself may be a semiconductor material having, in bulk or in layers, a suitable band gap to absorb the light emitted by the LED and emit the desired conversion wavelength. In particular, this material may be an epitaxially grown semiconductor material in which one or more quantum wells are formed. This semiconductor material may be present with or without a growth substrate. The semiconductor material may be separated into pieces of suitable size (semiconductor chips).

The term "vertical" describes an orientation running substantially perpendicular to the first surface of the semiconductor substrate or semiconductor body.

The terms "lateral" and "horizontal" describe an orientation or alignment running substantially parallel to a first surface of a semiconductor substrate or semiconductor body. This may be, for example, the surface of a wafer or of a die or of a chip.

To the extent that the terms "have," "contain," "comprise," "encompass" and the like are used here, they are open-ended terms indicating the presence of the stated elements or features, but do not exclude the presence of further elements or features. The indefinite articles and the definite articles encompass both the plural and the singular, unless the context clearly indicates otherwise.

The term "electrically connected" denotes a low-resistance electrical connection between the connected elements. The term "electrically connected" also encompasses tunnel contacts between the connected elements.

FIGS. 1A to 1K illustrate a method of producing an optoelectronic component in accordance with one or more examples.

As illustrated in FIG. 1A, optoelectronic semiconductor chips 100 are positioned on a suitable carrier 200. The optoelectronic semiconductor chips 100 here comprise a first and a second side surface 130, 140, respectively, facing one another, and also a third and a fourth side surface 145, 150 (illustrated in FIG. 1C), which intersect the first and second side surfaces. The first side surface 130 is arranged on the side from which the electromagnetic radiation emitted by the optoelectronic semiconductor component will be emitted. The semiconductor chip 100 may be an LED, for example. The semiconductor chip 100 may be implemented as a flip-chip. For example, the LED may comprise a first semiconductor layer 160 and also a second semiconductor layer 165, that are arranged above a carrier substrate 155, respectively. This is illustrated in the right-hand part of FIG. 1A.

By way of example, the carrier substrate 155 may be a sapphire substrate or any other substrate that is transparent to the emitted electromagnetic radiation. The carrier substrate 155 may be, for example, a growth substrate for growing the first and second semiconductor layers 160, 165. However, the carrier substrate 155 may also be different from the growth substrate. The first semiconductor layer 160 may be doped, for example, with a first conductivity type, e.g., n-type, and the second semiconductor layer may be doped, for example, with a second conductivity type, for example, p-type. Further layers, for example, semiconductor layers in which one or more quantum wells are formed may be arranged between the first and second semiconductor layers 160, 165 or adjacent to the first or the second semiconductor layer. The materials of the first and second semiconductor layers, apart from the conductivity type, may be identical or also different and may be suitable for generating electromagnetic radiation. By way of example, the semiconductor layers 160, 165 may be AlInGaN-based. A layer thickness of the carrier substrate 155 may be 50 to 600 µm, for example, and the thickness of the grown semiconductor layers is 3 to 15 µm, for example. The first and second semiconductor layers 160, 165 are usually formed over a suitable carrier substrate 155. Contact areas 115 for electrically contacting the first and/or second semiconductor layer are then formed on a first main surface 110. Since the exact way in which these layers are contacted is of minor importance for the method described or the optoelectronic semiconductor component described, a detailed description is dispensed with here.

The semiconductor chips 100 are positioned on the carrier 200 such that their first main surface 110, at which the contact areas 115 are provided, for example, faces the carrier 200, while the second main surface 120, at which the carrier substrate 155 may be present, for example, is arranged on the side of the semiconductor chip 100 remote from the carrier 200. The semiconductor chips 100 may be arranged, for example, such that first side surfaces 130 of adjacent semiconductor chips 100 are facing one another, respectively. Furthermore, the second side surfaces 140 may face one another, respectively. By way of example, the semiconductor chips 100 may be arranged such that the distance between adjacent first side surfaces 130 is greater than the distance between adjacent second side surfaces 140.

The carrier 200 may be composed of a material suitable for the further processing of the optoelectronic components. It may be a suitable film, for example. The semiconductor chips may have a height h of 50 to 1000 µm, for example. A length s measured along the third and fourth side surfaces may be approximately 100 to 2000 µm. The greater the length s, the greater the brightness of the emitted electromagnetic radiation with the same structural height and width of the finished component. The width b of the semiconductor chips 100 may be approximately 50 to 5000 μm. The smaller the width b, the greater the luminance with the same current supply to the component or a greater depth of the component. The greater the length b, the greater the brightness of the emitted electromagnetic radiation with the same structural height and depth of the finished component.

Figure 1B:
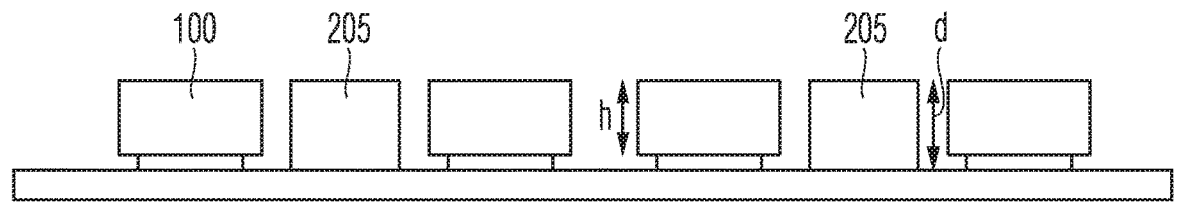

Next, as is illustrated in FIG. 1B, for example, a converter element 205 is introduced between two adjacent first side surfaces 130, respectively. The converter element may be a lamina or a plate, for example. Depending on the configuration of the converter material, the converter element may be, for example, a converter-filled cured resin or polymer material, a ceramic converter plate, a converter-in-glass plate, a semiconductor chip or a layer stack composed of a plurality of the converter elements mentioned. By way of example, in a layer stack, the individual converter elements may have different conversion properties, respectively. The shape of the converter elements 205 may be chosen in accordance with a desired brightness or luminance, for example. The converter elements may be individual laminae or alternatively, as shown in FIG. 1C, a string or in a linear fashion.

Figure 3A:
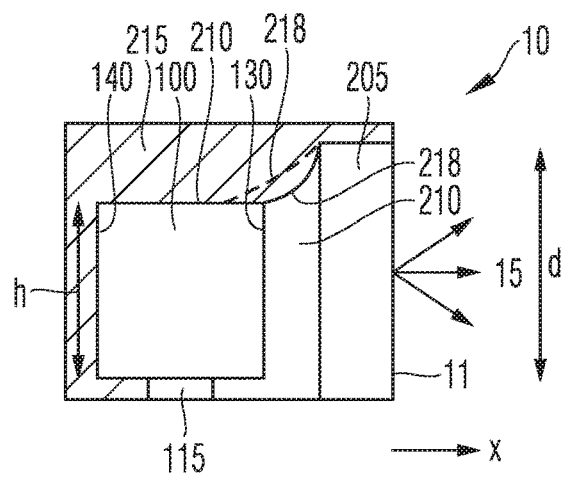
FIGS. 3A to 3D show cross-sectional views of elements of optoelectronic components in accordance with further examples.

The converter element 205 may have a thickness d that is exactly equal to a height h of the semiconductor chip 100. However, the thickness d of the converter element 205 may also be greater or smaller than the height h of the semiconductor chip. The thickness of the converter element 205 and the height of the semiconductor chip are measured in a direction perpendicular to a horizontal surface of the carrier 200, respectively. In this example, the height h is constituted by the thickness of the semiconductor chip 100 and of layers applied thereon such as the contact area 115, for example. In this example, the distance between converter element 205 and chip 100 may be dimensioned such that a transparent potting compound 210 to be filled later is drawn between semiconductor chip 100 and converter element 205 by capillary forces. By way of example, the distance may be dimensioned such that substantially no meniscus is formed in a vertical cross-sectional view. However, as illustrated in FIG. 3A it may also be provided that a certain meniscus is formed, by which a curved interface is formed, for example.

FIGS. 1C, 1D and 1E show various implementations of the converter element 205. In this regard, for example, the converter element 205 may be a string or line, the length of which is a multiple of the width b of the individual semiconductor chips 100. The length of the converter element 205 is measured along the y-direction, as illustrated in FIG. 1C. If the converter element 205 is implemented as a string or line, then the thickness d of the converter element may be constant. It may alternatively vary, as illustrated in the right-hand or lower part of FIG. 1C. By way of example, as illustrated under i), the maximum of the thickness may coincide with a position corresponding to the center point of the respective semiconductor chips 100. By way of example, the converter element implemented as a line or string may be planar or likewise patterned on a side adjacent to the carrier. The side of the converter element remote from the carrier 200 may likewise be patterned accordingly. By way of example, the patterning of the side facing the carrier 200 may be mirror-symmetrical with respect to the patterning of the side remote from the carrier 200.

Furthermore, in a line- or stringlike implementation of the converter element, the latter may be implemented such that various individual converter elements connect to one another by connecting webs. In this way, the method of producing the optoelectronic component may be simplified since the positioning of the converter element may be simplified. By way of example, the connecting webs may be made thin or have beveled edges. Region ii) of FIG. 1C illustrates the example wherein the edges are beveled. Region iii) of FIG. 1C illustrates that the surface patterning of the stringlike converter element is mirror-symmetrical, respectively. As illustrated in region iv) of FIG. 1C, the sidewalls of the individual converter elements joined to one another need not necessarily run perpendicular to the surface of the carrier 20, but rather may widen or taper toward the component edge. By way of example, the individual converter elements may be formed in a trapezoidal fashion.

The illustrations in regions i), ii), iii) and iv) should be understood merely as schematic illustrations of the shape of the converter element.

In further configurations, the width w of the converter elements 205 may correspond approximately to the width b of the semiconductor chips 100. This is shown in FIG. 1D. The widths b and w are measured along the y-direction, respectively, corresponding to the series direction of the semiconductor chips 100 arranged.

The width w of the converter element 205 may be somewhat greater than the width b of the semiconductor chips as shown in FIG. 1E, for example. The following relation may hold true, for example: $b<w\leq 3*b$ or $b<w\leq 2*b$.

The lower part of FIG. 1E shows cross-sectional views of examples of converter elements 205 in a (y,z)-plane, which intersects the x-direction. In this example, the width w of the converter elements 205 may be approximately the same size as the width b of the semiconductor chips 100 or may differ therefrom. By way of example, the height d of the converter elements may be equal to the height h of the semiconductor chips. The height d of the converter elements may be smaller than the height h of the semiconductor chips. The sidewalls of the converter elements 205 need not necessarily run perpendicular to the y-direction. They may also be implemented diagonally. By way of example, the converter elements may widen or taper toward the chip edge or in the z-direction.

Figure 1F:
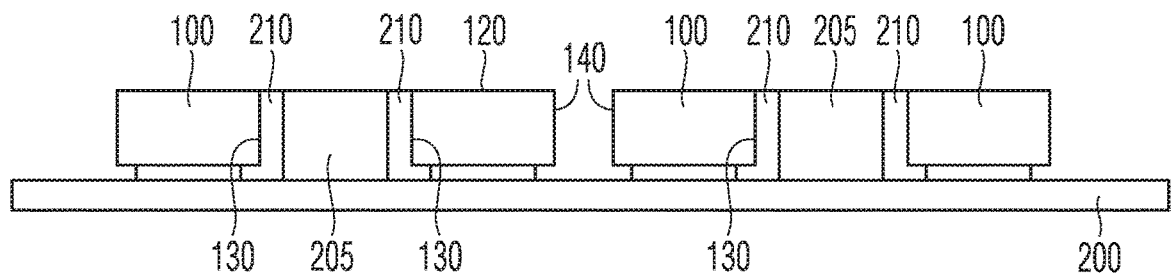
FIGS. 1F to 1G show schematic cross-sectional views of elements of optoelectronic components when carrying out the method in accordance with one or more examples.

Next, as shown in FIG. 1F, a first potting compound, for example, a transparent potting compound 210 (curing clear potting or adhesive) is introduced between converter element 205 and semiconductor chip 100. By way of example, the transparent potting compound 210 may be dispensed. The transparent potting compound 210 is introduced such that it completely fills the space between first side surface 130 of the semiconductor chip and converter element 205, for example. The transparent potting compound 210 adjoins the first side surface 130. By way of example, the transparent potting compound 210 may be silicone, epoxy resin or a hybrid material based on a silicone-epoxy mixture, for example. The space between second side surfaces 140 is not filled with the transparent potting compound 210.

Figure 1G:
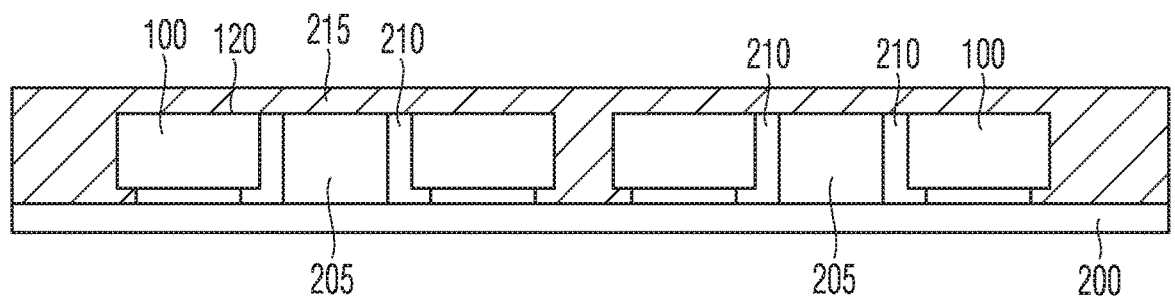

A reflective potting compound 215 is then potted or cast such that it covers the exposed surfaces 120, 145, 150 of the semiconductor chip. The reflective potting compound may be, for example, silicone or some other suitable resin or polymer material comprising $ZrO_2$, $SiO_2$ or $TiO_2$ particles, for example. Layer thickness and concentration of the $TiO_2$ particles may be dimensioned such that a sufficient reflectivity of the layer is provided. Generally, however, it is possible to use any desired reflective potting compound that provides a sufficient reflectivity. FIG. 1G shows one example of a resulting cross-sectional view after potting with the reflective potting compound.

Figure 1I:
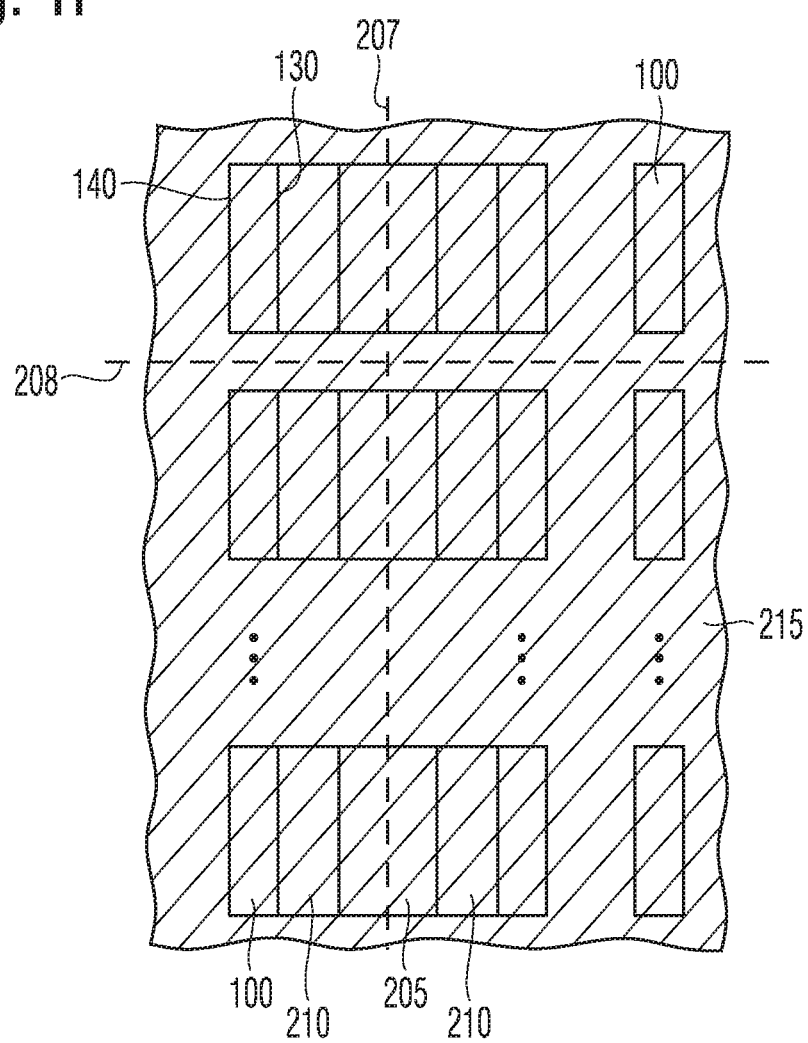
Figure 1J:
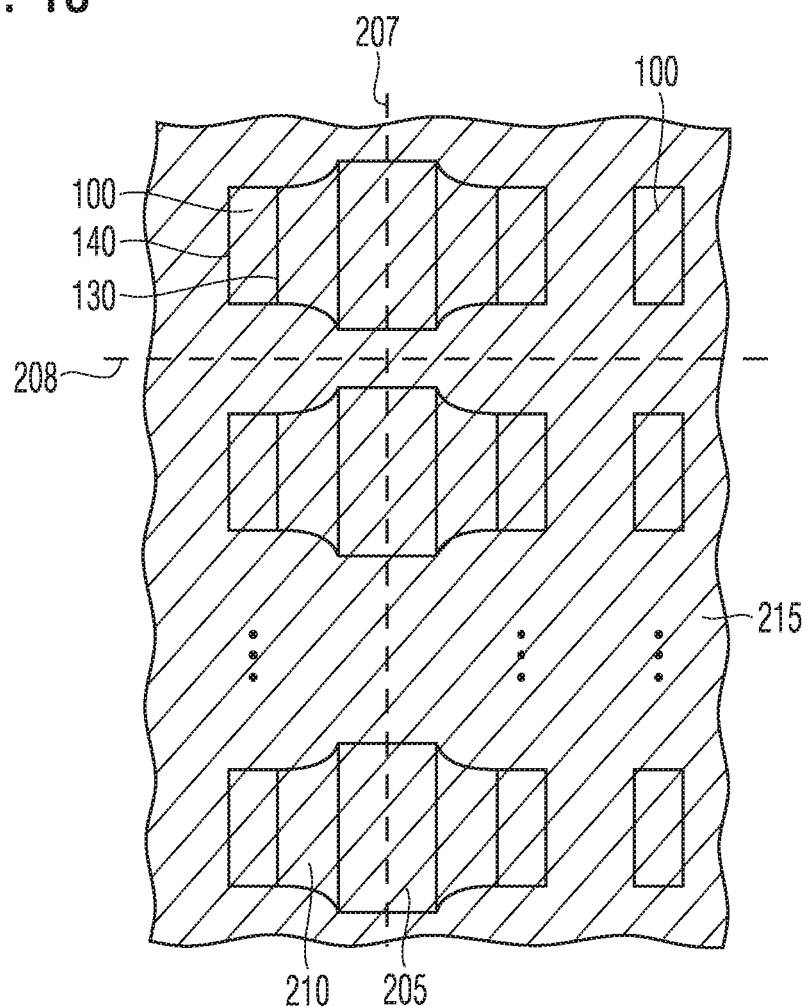

FIGS. 1H to 1J show examples of horizontal cross-sectional views of the arrangement illustrated in FIG. 1G.

In accordance with FIG. 1H, the converter element 205 is implemented as illustrated in FIG. 1C. In this example, the reflective potting compound 215 fills the spaces between adjacent semiconductor chips 100. Reference signs 207, 208 denote sawing or separating lines along which the individual optoelectronic components are singulated in a later method step. When singulating the individual optoelectronic components along the line 208, both the converter element 205 and the first potting compound 210 must be cut.

In accordance with the arrangement shown in FIG. 1I, in which the converter elements 205 are implemented as in FIG. 1D, the singulation takes place along the separating line 208 through the reflective potting compound. In accordance with the illustration shown in FIG. 1J, in which the converter elements 205 are implemented as illustrated in FIG. 1E, the transparent potting compound 210 forms a meniscus such that the interface between reflective potting compound 215 and first potting compound 210 is also arcuate.

Figure 1K:
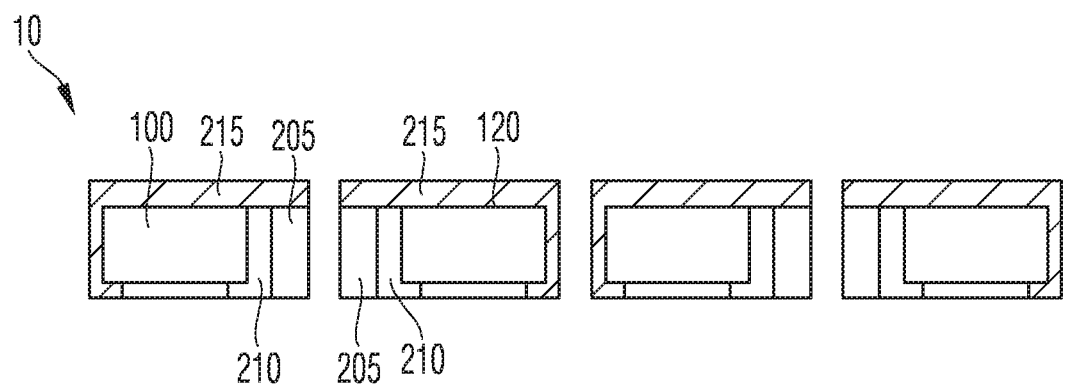
FIG. 1K shows a schematic cross-sectional view through elements of optoelectronic components when carrying out the method in accordance with one or more examples.

Afterward, the carrier is removed. Furthermore, the individual semiconductor components are singulated by sawing or laser cutting, for example. The singulating may take place before or after removing the carrier. FIG. 1K shows a schematic illustration of this process.

Figure 2A:
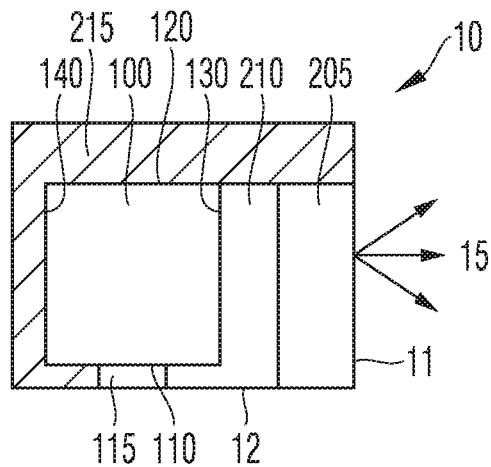
FIGS. 2A and 2B show schematic cross-sectional views of optoelectronic components in accordance with examples.
Figure 2B:
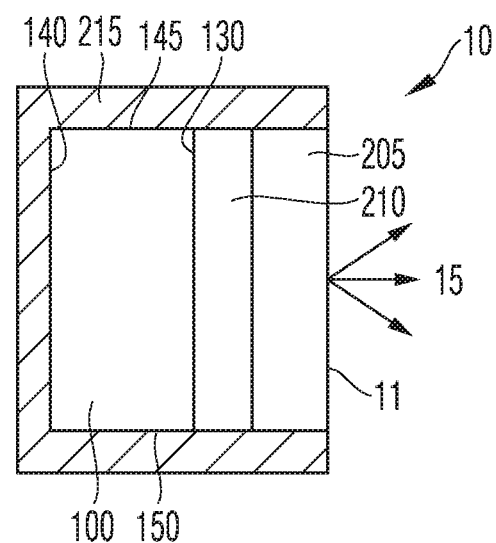

FIG. 2A shows a cross-sectional view perpendicular to the first main surface 110 of the optoelectronic component in accordance with one or more examples. FIG. 2B shows a cross-sectional view parallel to a main surface 110 of the optoelectronic component. The optoelectronic component 10 comprises an optoelectronic semiconductor chip 100 comprising a first side surface 130 and a second side surface 140 facing one another, respectively, and also a third side surface 145 and a fourth side surface 150. The third and fourth side surfaces 145, 150 are facing one another and each intersect both the first side surface 130 and the second side surface 140. The semiconductor chip 100 has a first main surface 110, over which at least one contact area 115 is arranged. The semiconductor chip comprises a first potting compound 210, which adjoins the first side surface 130.

As is illustrated in FIGS. 2A and 2B, a converter element 205 is furthermore arranged on the side of the first side surface 130. The first potting compound 210 is arranged between first side surface 130 and converter element 205. For example, the converter element 205 is arranged to be directly adjacent to the first potting compound 210. The optoelectronic component 10 furthermore comprises a reflective potting compound 215, directly adjacent to the second side surface 140. The reflective potting compound 215 may furthermore be at least partly directly adjacent to the third and fourth side surfaces 145, 150, respectively, and also may be directly adjacent to the second main surface 120 of the semiconductor chip 100. By way of example, the reflective potting compound may furthermore be directly adjacent to a region between second side surface 140 and contact area 115 in the region of the first main surface 110. A part of the first potting compound 210 may be arranged between the third or fourth side surface and the reflective potting compound. Furthermore, a part of the first potting compound may be arranged between the second main surface and the reflective potting compound 215. In the cross-sectional view of FIG. 2B, the semiconductor chip 100 is thus surrounded by the reflective potting compound 215 at least three sides thereof. By way of example, the reflective potting compound 215 forms a termination or a housing of the optoelectronic component 10 at five sides of the optoelectronic component. The combination of reflective potting compound, converter element 205 and optionally first potting compound 210 may form a termination of the optoelectronic component 10.

As illustrated in FIGS. 2A and 2B, electromagnetic radiation 15 is emitted from a first side surface 11 of the component. The first side surface 11 of the component is arranged at a side adjacent to the first side surface 130 of the semiconductor chip. A side surface of the converter element 205 may form the first side surface of the component 11, for example. As illustrated in FIGS. 2A and 2B, an optoelectronic component that emits electromagnetic radiation 15 from a first side surface 11 of the component, for example, may be electrically contacted by a first main surface 12 of the component via contact areas 115. The optoelectronic component 10 may be realized in a compact manner since, for example, the reflective potting compound 215 is directly adjacent to the semiconductor chip 100 and has been applied directly to the semiconductor chip 100. The further elements, for example, the first potting compound 210 and also the converter element 205, are also arranged adjacent to the first side surface of the semiconductor chip 130 in a space-saving manner. In particular, the optoelectronic component 10 has a small height in a direction perpendicular to its first main surface 12. The optoelectronic component thus constitutes a chip size package. As has been described with reference to FIGS. 1A to 1K, a multiplicity of optoelectronic components 10 may be produced simultaneously by parallel processing as a result of which the method may furthermore be simplified.

Figure 2C:
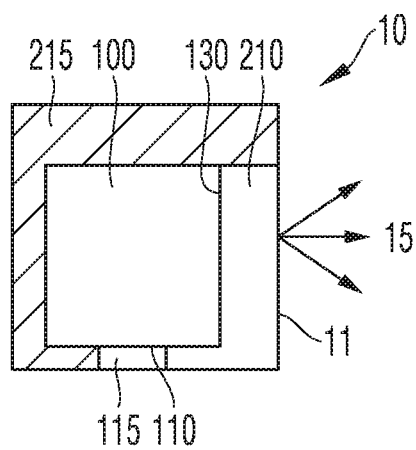
FIGS. 2C and 2D show schematic cross-sectional views of optoelectronic components in accordance with further examples.
Figure 2D:
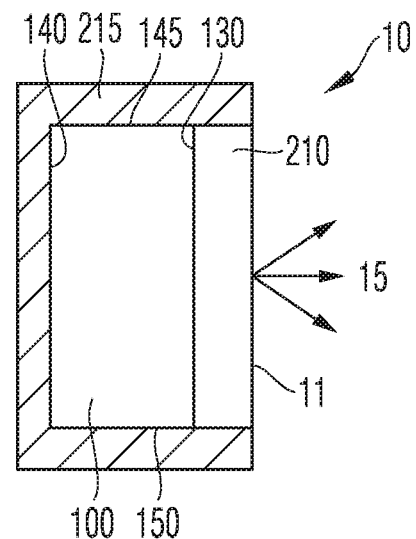

FIGS. 2C and 2D show cross-sectional views perpendicular to the first main surface 110 of the semiconductor chip 100 and parallel to the first main surface 110 of the semiconductor chip in accordance with further examples, respectively. The optoelectronic component illustrated in FIGS. 2C and 2D is identical to that shown in FIGS. 2A and 2B, with the exception that the converter element 205 is omitted. As will be readily appreciated by those skilled in the art, if, for example, the converter element 205 is omitted and the semiconductor chips 100 are arranged at an adapted, if appropriate reduced, distance from one another on the carrier 200, respectively, the optoelectronic component illustrated in FIGS. 2C and 2D may be produced. In this example, the exposed side surface of the transparent potting compound 210 represents a first side surface 11 of the component. Components without converters may be produced in this way. However, it is also possible to introduce, e.g., powder conversion materials into the first potting compound 210. Accordingly, with the first potting compound 210 being implemented in this way, it is possible to produce optoelectronic components with conversion.

Figure 2E:
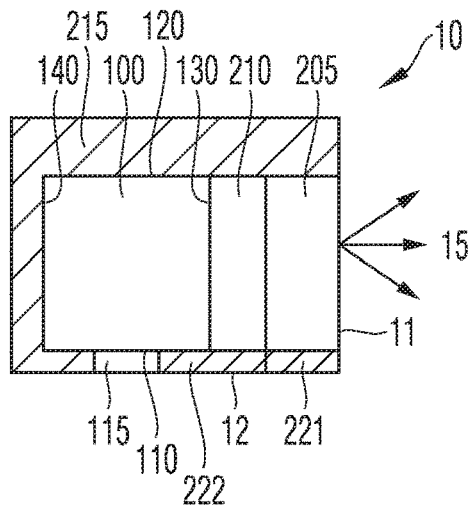
FIG. 2E shows a schematic cross-sectional view of an optoelectronic component in accordance with further examples.

FIG. 2E shows a schematic cross-sectional view of an optoelectronic component 10 in accordance with further examples. The optoelectronic component 10 is implemented in a similar manner to the one shown in FIG. 2A. In addition, a reflective material 221 is arranged at the side of the first main surface 110 of the semiconductor chip 100 of the converter element 205. Furthermore, additionally or alternatively, a reflective material 222 may be provided at the side of the first main surface 110 of the semiconductor chip 100 of the first potting compound 210.

The reflective material 221 at the bottom side of the converter element 205 may be provided, for example, by forming the reflective material 221 on the side of the converter element 205 facing the carrier 200. By way of example, the reflective material 221 may be a specularly reflective layer comprising a metallic or dielectric layer or a combination of these layers. Furthermore, the reflective material 221 may be diffusely reflective and be implemented, for example, by a $ZrO_2$-, $SiO_2$- or $TiO_2$-filled resin or polymer layer or ceramic.

The reflective material 221 and/or 222 further reduces an emission of light in the direction of the first main surface 110. The reflective material 221 and/or 222 may be produced by the method variant described with reference to FIGS. 4D and 4E.

During production of the optoelectronic component, the converter lamina 205 or the string-shaped converter element 205 may have spacers from the carrier 200 at certain distances. In this manner, the reflective potting compound 215 may creep under the plate and the latter may thus be "sealed" toward the bottom. When using string-shaped converter elements or continuous converter laminae, the spacers may be positioned such that they will be removed when the opto-electronic components are singulated later. By way of example, they may be applied in a separating region between the semiconductor chips 100. Depending on the material of the converter element, for the sake of simplicity, the spacers may also be made from the material of the converter element plate, for example, when using converter elements made of glass or ceramic.

FIG. 3A shows a schematic cross-sectional view of an optoelectronic component in accordance with a further example. In contrast to the component illustrated in FIG. 2A, the height d of the converter element 205 is greater than the height h of the semiconductor chip 100. The transparent potting compound 210 is introduced into the space between converter element 205 and semiconductor chip 100 such that a meniscus is formed. As a result, the interface 218 between reflective potting compound 215 and first potting compound 210 is arcuate. This type of implementation of the reflective potting compound 215 enables the reflectivity of the reflective potting compound to be influenced in a suitable manner so that increased light focusing or concentration occurs in the x-direction. With suitable modification of the method of producing the optoelectronic component, for example, by replacing the converter element 215 being by a lamina or plate composed of transparent cured potting compound, the component illustrated in FIG. 3A may also be modified such that first potting compound 210 and reflective potting compound 215 have the shape illustrated in FIG. 3A, even if no converter element 205 is present. Depending on the geometry of the arrangement and the size of the converter element 205 and also the constitution of the first potting compound 210, a part of the first potting compound 210 may also be present between, for example, the second main surface 120 of the semiconductor chip and the reflective potting compound 215, as is illustrated by the dashed interface 218 in FIG. 3A.

Figure 3B:
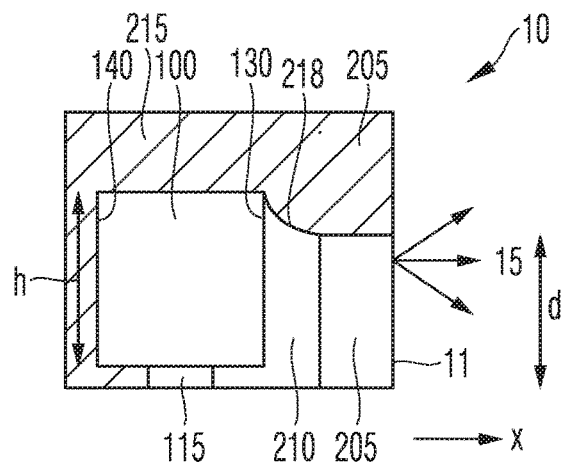

In accordance with the example illustrated in FIG. 3B, the height d of the converter plate 205 may also be smaller than the height h of the semiconductor chip. A meniscus is also formed. This arrangement may be advantageous if a high luminance is intended to be achieved at the side surface 11 of the component.

Figure 3C:
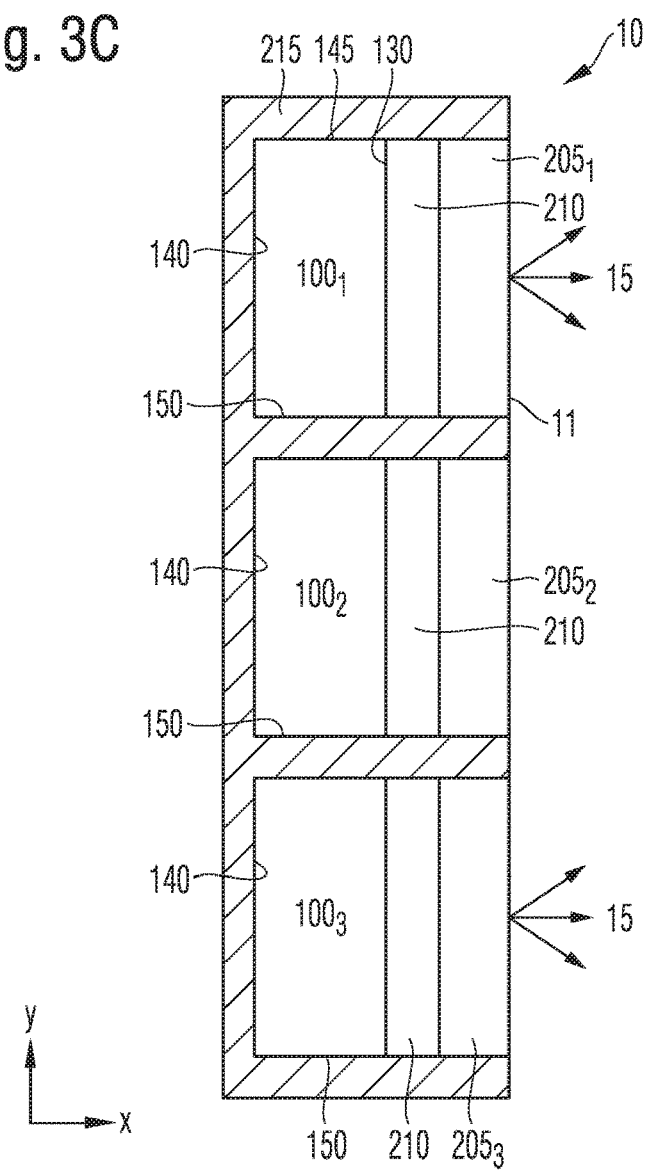

The respective optoelectronic components do not need to be singulated such that one single semiconductor chip is provided per optoelectronic component. It is possible for an optoelectronic component to comprise a plurality of semiconductor chips. As illustrated in FIG. 3C, by way of example, a plurality of semiconductor chips $100_1, \ldots 100_n$ may be arranged next to one another along the y-direction. By way of example, the semiconductor chips $100_1$, $100_2$, $100_3$ illustrated in FIG. 3B may emit light of different wavelengths, respectively. By way of example, the semiconductor chip $100_1$ may be an LED that emits red light, the semiconductor chip $100_2$ may be an LED that emits green light, and the semiconductor chip $100_3$ may be an LED that emits blue light.

Examples in which an optoelectronic component comprises more than one semiconductor chip may be varied in many ways. By way of example, when the individual semiconductor chips $100_1, 100_2, \ldots 100_3$ emit electromagnetic radiation of different wavelengths, respectively, the converter 205 may be at least partly omitted or adapted in a suitable manner. By way of example, a transparent plate may be provided instead of the converter element 205. The semiconductor chip $100_1$, $100_2$, $100_3$ may be identical, respectively, and the converter elements $205_1$, $205_2$, $205_3$ may be implemented differently, respectively. Furthermore, both the semiconductor chips $100_1$, $100_2$, $100_3$ and the converter elements $205_1$, $205_2$, $205_3$ may be at least partially implemented in a different manner. By way of example, the semiconductor chips $100_1$, $100_2$, $100_3$ may be suitable for emitting blue light, respectively, and no converter element is present at a first semiconductor chip $100_1$, while the converter element $205_2$ that is assigned to the second semiconductor chip $100_2$ is a completely red-converting converter element and the converter element $205_3$ assigned to the third semiconductor chip $100_3$ is a completely green-converting converter element. By way of example, it is possible to combine a blue-emitting semiconductor chip with a transparent plate or lamina with a blue-emitting semiconductor chip with a completely green-converting converter element and further a red-emitting semiconductor chip with a transparent plate.

Figure 3D:
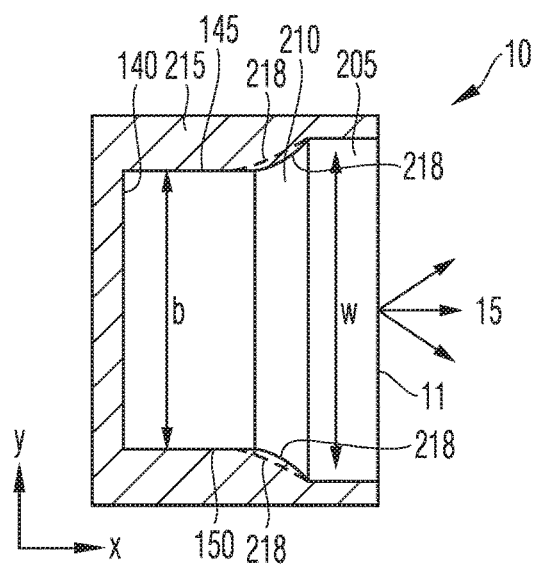

In accordance with the example illustrated in FIG. 3D, the width w of the converter element 205 may be greater than the width b of the semiconductor chip. The widths b and w are measured along the y-direction, respectively. The first potting compound 210 may also be implemented such that an arcuate meniscus is formed. As a consequence, an interface between reflective potting compound 215 and first potting compound 210 may also be arcuate. As a result, an improved brightness of the optoelectronic component may be provided. Furthermore, by curving the interface between reflective potting compound 215 and first potting compound 210 the light emission characteristic may be set appropriately.

Depending on the distance between semiconductor chip 100 and converter element 205 or the general geometry of the arrangement, a part of the first potting compound 210 may also be arranged adjacent to the third and fourth side surfaces 145, 150 such that the arcuate interface between reflective potting compound 215 and first potting compound 210 partially overlaps the semiconductor chip 100 along the y-direction. This is indicated by the dashed interface 218 in FIG. 3D.

Figure 4A:
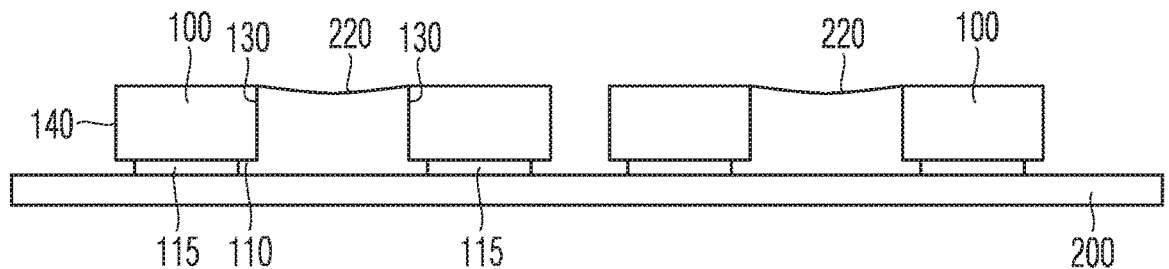
FIGS. 4A to 4E show cross-sectional views of elements of optoelectronic components when carrying out variants of the method described.

Further variants of the method illustrated in FIGS. 1A to 1K are explained with reference to FIGS. 4A to 5E. By way of example, a first potting compound 220 comprising a converter material may be used instead of the converter element 205. By way of example, this potting compound may be composed as described above and may additionally comprise a converter admixture. By way of example, the distance between adjacent first side surfaces 130 of the semiconductor chip 100 may be dimensioned such that no meniscus is formed between the first side surfaces 130. FIG. 4A shows a cross-sectional view of semiconductor chips 100 with a converter-containing potting compound 220 arranged therebetween.

Figure 4B:
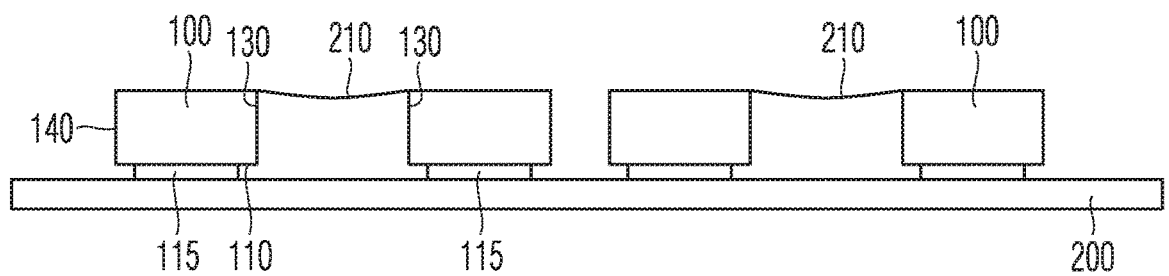

As illustrated in FIG. 4B, a transparent potting compound 210 may be formed between adjacent first side surfaces 130 of semiconductor chips 100. The transparent potting compound 210 may contain no converter material, for example. In this example, the completed component, illustrated in FIGS. 2C and 2D, for example, emits the electromagnetic radiation through the side surface 11 without passing through a converter.

Figure 4C:
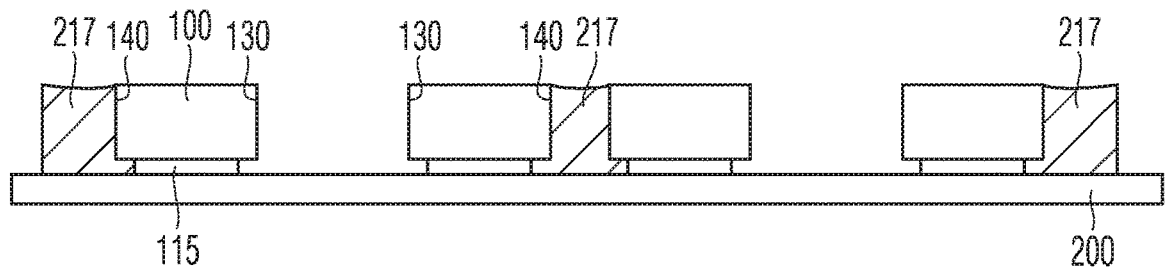

A reflective prepotting compound 217 may be introduced before the first potting compound 210, 220 is introduced. By way of example, the reflective prepotting compound 217 may be introduced to be directly adjacent to the second side surface 140. The reflective prepotting compound 217 may also fill the space between first main surface 110 of the semiconductor chip and carrier substrate 200 between the second side surface 140 and the contact area 115. FIG. 4C illustrates a cross-sectional view of a corresponding chip arrangement.

This reflective prepotting compound 217 may additionally be introduced in the region of the first side surface 130. This method step may be implemented such that the prepotting compound 217 creeps below the semiconductor chip 100 toward the first side surface 130 and forms a meniscus. In this example, the reflective prepotting compound 217 is formed, for example, such that the first side surface 130 of the semiconductor chip 100 is not covered by the reflective prepotting compound 217. By way of example, the region between first main surface 110 of the semiconductor chip and carrier 200 may be filled with the reflective prepotting compound 217 to completely line the "underside" of the optoelectronic semiconductor component with reflective prepotting compound 217. By way of example, the contact areas 115 may be implemented in a suitable manner in this examples. By way of example, their height or the height of the contact pads may be correspondingly increased so that the space may be better filled.

Irrespective of whether or not a reflective prepotting compound 217 is first introduced, an increased height of the contact areas 115 or contact pads may result in a minimum thickness of the reflective potting compound 215, 217, thereby ensuring that it also has a reflective effect. In other words, the distance between first main surface 110 and carrier 200 may be set by setting the height of the contact areas 115 or contact pads. This setting may be effected taking into account the density of the reflective particles of the reflective potting compound, for example, the $TiO_2$ particle density to bring about a sufficient reflectivity of the reflective potting compound 215, 217. By way of example, the contact areas may be electrolytically reinforced, as a result of which the strength of the optoelectronic components is additionally increased.

Figure 4D:
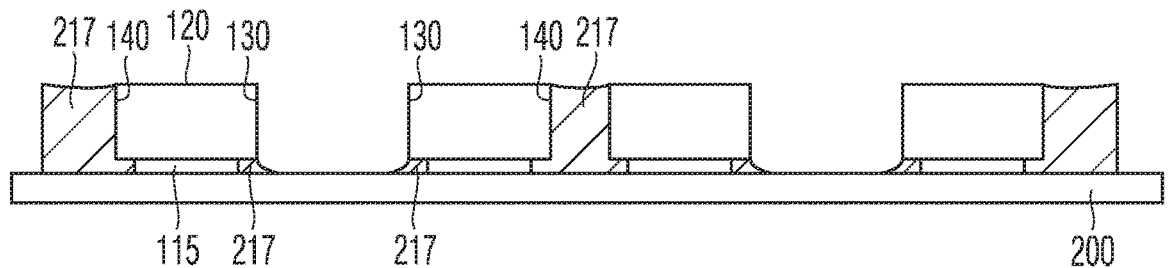
Figure 4E:
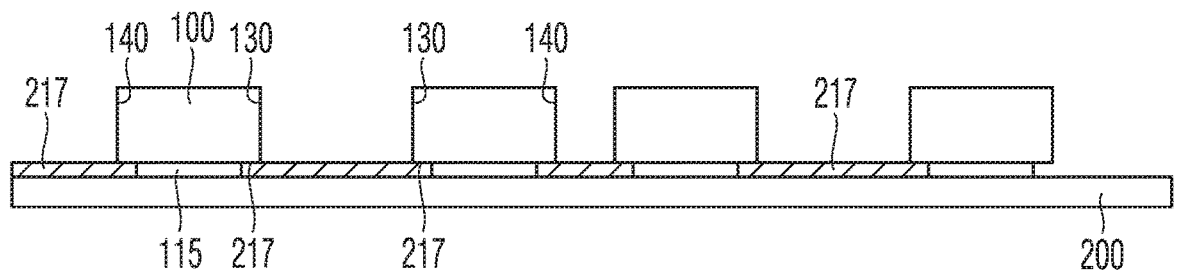

FIGS. 4D and 4E show examples of schematic cross-sectional views of a chip arrangement, respectively, after the reflective prepotting compound 217 has been introduced. Introducing the reflective prepotting compound 217 makes it possible to avoid stray light and light of an undesired color downward, i.e., in the direction of the first main surface 110 of the semiconductor chip 100. In the absence of reflective prepotting compound 217, light of an undesired color may be generated, for example, by virtue of the emitted light not having passed through the converter element 205 or having passed through the converter element 205 only to an insufficient extent. Furthermore, it is possible to prevent the transparent or converter-containing potting compound 210, 220 from creeping below the semiconductor chip 100, i.e., into the space between first main surface 110 of the semiconductor chip and carrier 200.

In accordance with the example shown in FIG. 4E, the prepotting compound 217 covers the bottom portion and creeps under the chips. It does not form any menisci. By way of example, the prepotting compound 217 is of such low viscosity that no meniscus is formed, or the semiconductor chips 100 are constituted or coated such that the prepotting compound 217 does not creep along them and form a meniscus. As a result, in a particularly suitable manner, an emission of light downward, that is to say in the direction of the first main surface 110, may be suppressed. Introducing the reflective prepotting compound 217 is combinable with all examples. In particular, when introducing the reflective prepotting compound 217, as described in FIGS. 4D and 4E, the optoelectronic component shown in FIG. 2E may be produced in a simple manner.

Figure 5A:
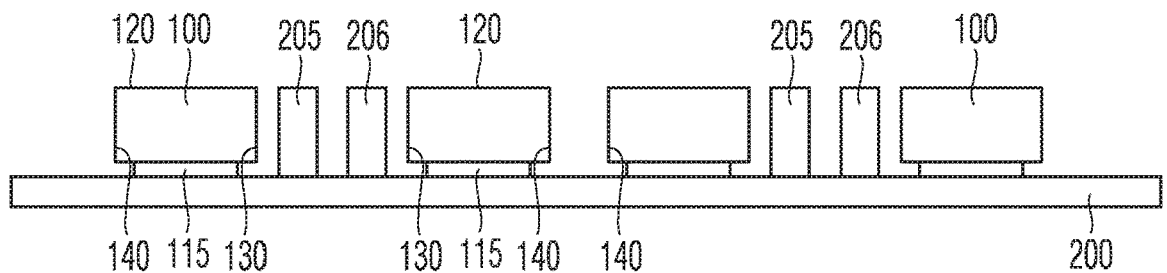
FIGS. 5A to 5E show cross-sectional views of elements of optoelectronic components when carrying out further method variants.

Instead of one converter element, a plurality of converter elements 205, 206 may also be arranged between adjacent side surfaces 130 of semiconductor chips 100. FIG. 5A shows one example in which two converter elements 205, 206 are arranged between two second side surfaces 130, respectively. The converter elements may be implemented as described in the previous examples.

Figure 5B:
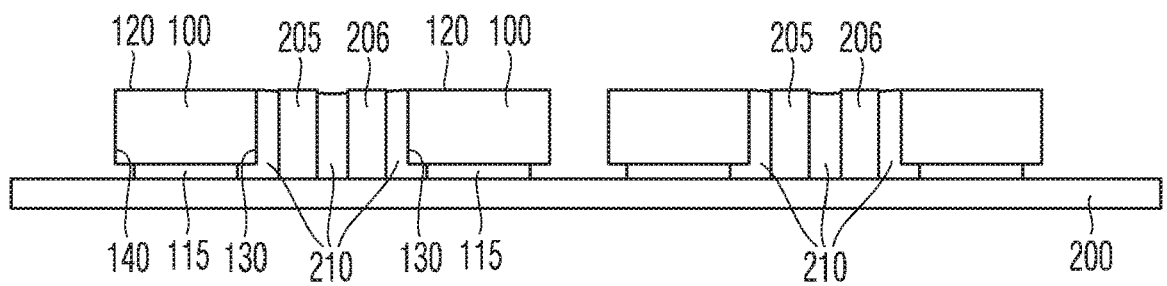

As shown in FIG. 5B, then, a transparent potting compound 210 is introduced by filling between the converter elements 205, 206 and between the converter elements 205 or 206 and the first side surfaces 130, respectively. Given such a configuration of the converter elements, the optoelectronic components may be cut between two converter elements 205, 206, respectively. This involves the advantage that the converter element 205 itself is not cut. Instead, the separation is effected outside the converter element. As a consequence, a thickness variation and thus a change in the color locus of the converter element may be avoided. As a consequence, the color locus is determined only by the thickness of the converter elements 205, 206 and not by the location at which the singulation is carried out.

This procedure suppresses possible damage to the converter element when the phosphor material of the converter element 205 is a semiconductor material, in particular one having one or more active zone(s). By way of example, converter elements comprising a semiconductor material may react sensitively to damage. Furthermore, the behavior of the converters may be particularly sensitive with regard to the location of cutting. In this example, this configuration of the converter element may reduce the influence of the exact positioning of the separating position.

Figure 5C:
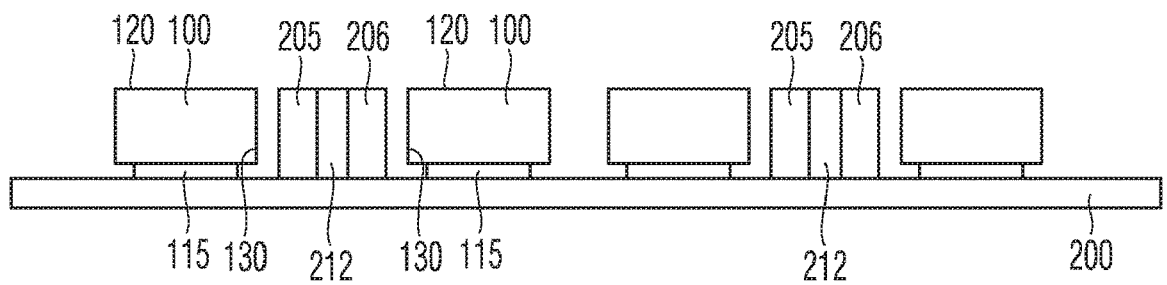

As illustrated in FIG. 5C, for example, a composite assembly composed of converter elements 205, 206 and intermediate layer 212 arranged therebetween may be introduced between first side surfaces 130 of adjacent semiconductor chips 100. In this example, the intermediate layer 212 may be cut in the same way as described with reference to FIG. 5B. The material of the intermediate layer 212 may be chosen such that it is removable after the optoelectronic components have been singulated, thus resulting in a defined emission surface. This configuration is also expediently combinable with converter elements which are based on a semiconductor material and comprise in particular semiconductor layers stacks.

Figure 5D:
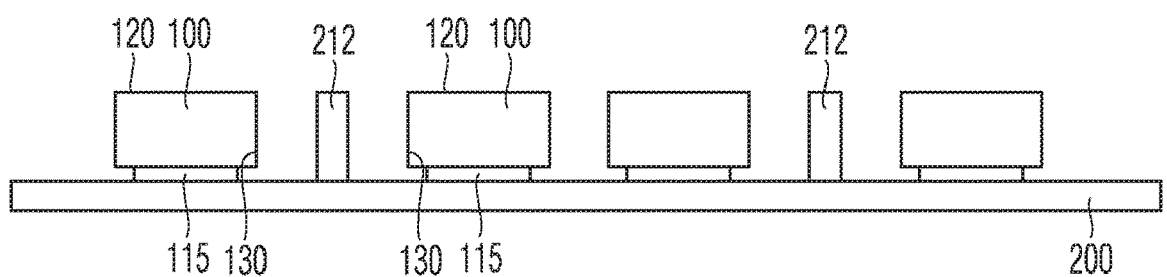

The intermediate layer 212 may be introduced between first side surfaces 130 of adjacent semiconductor chips as a separate material plate analogously to the formation of the converter element 205, as illustrated in FIGS. 1C to 1E. This is illustrated in FIG. 5D, for example.

Figure 5E:
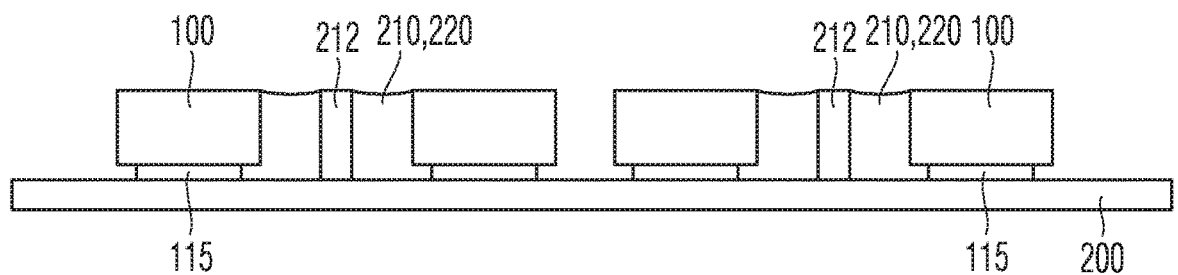

A potting compound 210, 220 that may be implemented, for example, as a transparent or converter-containing potting compound 210, 220, is then introduced between intermediate layer 212 and first side surface 130, respectively. This is illustrated in FIG. 5E, for example. The individual optoelectronic components are then singulated as described above. By way of example, the intermediate layer 212 may be stripped out after or during the singulation of the individual components such that the exposed side surface of the potting compound 210, 220 arises as first side surface of the component. Also by way of example, the first potting compound may be implemented as a transparent potting compound so that there is no conversion of the emitted wavelength.

The examples described above may be combined with one another in any desired manner.

As has been explained, my method provides an optoelectronic component that emits electromagnetic radiation 15 through a first side surface of the component 11, the first side surface running perpendicular to the main surface of the semiconductor chip. The method is able to be carried out in a simple manner and provides an optoelectronic component having a compact design and a high radiation efficiency.

Figure 6A:
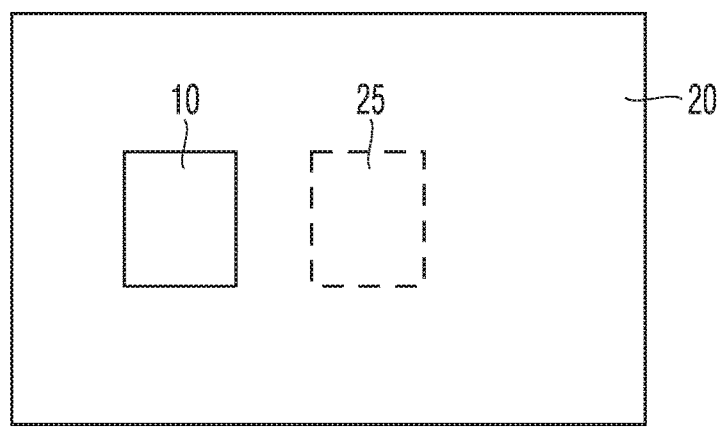
FIGS. 6A to 6C illustrate electrical devices in accordance with examples.

FIG. 6A shows a schematic view of an electrical device 20 in accordance with one example. The electrical device 20 comprises the optoelectronic component 10. The electrical device 20 may be, for example, a mobile communication device such as a cellphone, and the optoelectronic component is an element of the cellphone illumination. Due to the flat design of the optoelectronic component 10, the optoelectronic component 10 may be used advantageously in applications of this type. The electrical device 20 may comprise an optical waveguide 25 that distributes the electromagnetic radiation emitted by the optoelectronic component 10 in a suitable manner. By way of example, an electrical device of this type may be or contain a liquid crystal display (LCD), for example, for mobile communication devices, display devices, televisions or computers, or a marking display, in which a uniform light distribution is generated by the optical waveguide 25.

Figure 6B:
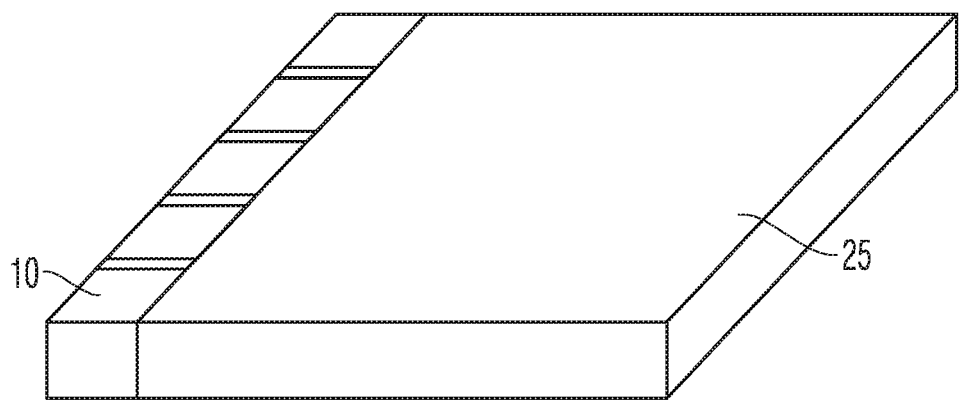

FIG. 6B shows one example of a combination of the optoelectronic component 10 with an optical waveguide 25. Due to the compact and flat design of the laterally emitting optoelectronic component 10, it may be used advantageously in combination with a likewise flat optical waveguide 25. By way of example, as illustrated in FIG. 6B, optoelectronic components 10 may be arranged at the side of the optical waveguide 25.

Figure 6C:
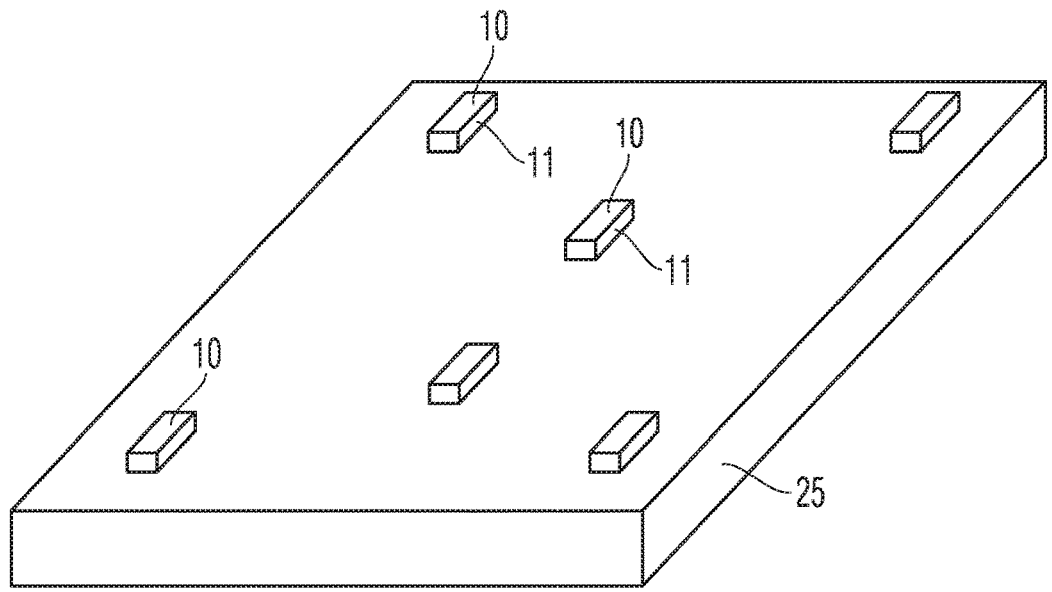

Due to the particularly flat design of the optoelectronic components, it is also possible to integrate them directly into an optical waveguide 25. FIG. 6C shows a further example of a corresponding element of an electrical device. In this example, the optoelectronic components may be arranged on a suitable carrier, for example, a printed circuit board (PCB, not illustrated) such that the contact areas 115 are respectively drivable by lines of the printed circuit board. An emission surface 11 of the optoelectronic components runs perpendicular to the surface of the printed circuit board. A material for forming the optical waveguide 25, for example, a transparent resin or polymer compound, is introduced over and between the optoelectronic components 10. As a consequence, the optoelectronic components 10 are embedded into the optical waveguide. Scattering bodies and/or masking parts may be formed over the optical waveguide 25. In this way, it is possible to realize a component of flat design for "local" backlighting. By way of example, such a component may be combined with an LCD ("liquid crystal device"). The individual optoelectronic components 10 embedded into the optical waveguide 25 may be locally switched on and off. Accordingly, it is possible to obtain an inhomogeneous brightness distribution. By way of example, dark locations in an image may be backlit more darkly, for example, to generate a higher contrast.

Figure 7:
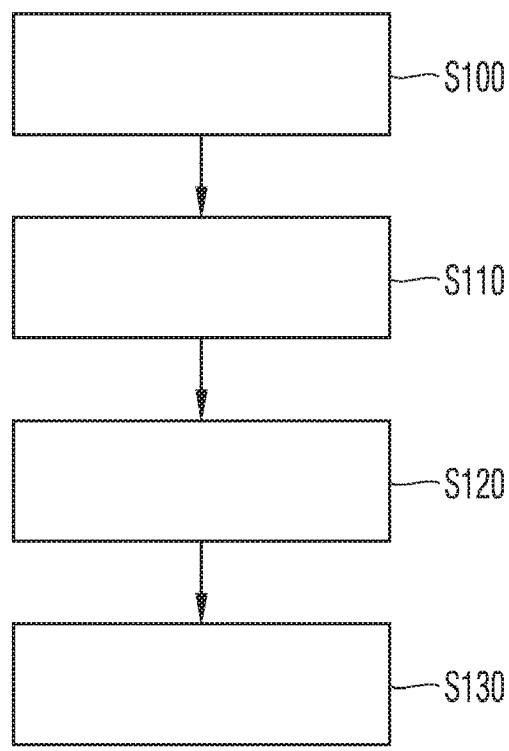
FIG. 7 illustrates the method in accordance with one or more examples.

FIG. 7 summarizes my method. My method of producing optoelectronic components comprises arranging S100 optoelectronic semiconductor chips on a carrier. The optoelectronic semiconductor chips comprise a first and a second side surface, respectively, that are facing one another, and also a third and a fourth side surface that intersect the first and second side surfaces. The semiconductor chips furthermore have a first main surface, at which at least one contact area is arranged. The semiconductor chips are arranged on the carrier such that the first main surface is positioned in each examples adjacent to the carrier, respectively. A first potting compound is introduced S110 between adjacent light-emitting elements such that the first potting compound is directly adjacent to the first side surface, respectively. A reflective potting compound is applied S120 such that the reflective potting compound adjoins the second side surface. The light-emitting elements are singulated S130.

Although specific examples have been illustrated and described herein, those skilled in the art will recognize that the specific examples shown and described may be replaced by a multiplicity of alternative and/or equivalent configurations, without departing from the scope of protection of this disclosure. The application is intended to cover any adaptations or variations of the specific examples discussed herein. Therefore, this disclosure is restricted only by the appended claims and the equivalents thereof.

This application claims priority of DE 10 2018 106 972.3, the subject matter of which is incorporated herein by reference in its entirety.

The invention claimed is:

1. An optoelectronic component comprising:
an optoelectronic semiconductor chip comprising a carrier substrate, a first and a second side surface facing one another, respectively, and a third and a fourth side surface that intersect the first and second side surfaces, and a first main surface, at which at least one contact area is arranged, said carrier substrate being transparent to the emitted electromagnetic radiation,
a transparent first potting compound directly adjacent to the first side surface;
a reflective potting compound directly adjacent to the second side surface and the carrier substrate and applied directly to the semiconductor chip, and
a converter element on a side of the first side surface, wherein the first potting compound is arranged between the first side surface and the converter element.

2. The optoelectronic component according to claim 1, wherein the reflective potting compound adjoins a region between second side surface and contact area.

3. The optoelectronic component according to claim 1, wherein the first potting compound comprises a converter material.

4. The optoelectronic component according to claim 1, wherein a height of the converter element differs from a height of the optoelectronic semiconductor chip, and the height of the semiconductor chip is measured perpendicular to the first main surface.

5. The optoelectronic component according to claim 1, configured to emit electromagnetic radiation in a direction perpendicular to the first main surface.

6. The optoelectronic component according to claim 1, wherein the reflective potting compound comprises a resin or polymer material including $ZrO_2$, $SiO_2$ or $TiO_2$ particles.

7. The optoelectronic component according to claim 1, wherein the reflective potting compound at least partly adjoins the third and fourth side surfaces and a second main surface, respectively, and is applied directly to the semiconductor chip.

8. A method of producing optoelectronic components, comprising:
arranging optoelectronic semiconductor chips comprising a first and a second side surface facing one another, respectively, and a third and a fourth side surface, that intersect the first and second side surfaces, and a first main surface, at which at least one contact area is arranged, respectively, on a carrier substrate such that the first main surface is positioned directly adjacent to the carrier substrate, respectively, said carrier substrate being transparent to the emitted electromagnetic radiation;
introducing a transparent first potting compound between adjacent semiconductor chips such that the first potting compound adjoins the first side surface, respectively;
applying a reflective potting compound such that the reflective potting compound adjoins the second side surface of the optoelectronic semiconductor chips and the carrier substrate; and
singulating the optoelectronic components such that each optoelectronic component comprises at least one optoelectronic semiconductor chip,
wherein the reflective potting compound is applied such that it additionally at least partly adjoins the third and fourth side surfaces and also a second main surface, respectively.

9. The method according to claim 8, further comprising introducing converter elements on the side of the first side surface, respectively, wherein the first potting compound is introduced between converter element and first side surface.

10. The method according to claim 9, wherein the converter element is introduced before the first potting compound is introduced.

11. The method according to claim 9, wherein the converter element is introduced after or at the same time as the first potting compound is introduced.

12. The method according to claim 8, wherein, before introducing the first potting compound, a reflective prepotting compound is further introduced directly adjacent to the second side surface.

13. The method according to claim 8, further comprising introducing an intermediate layer before the first potting compound is introduced.

14. The method according to claim 8, wherein at least two converter elements are introduced between two optoelectronic semiconductor chips and singulating is carried out between the at least two converter elements.

15. The method according to claim 14, wherein an intermediate layer is introduced between two converter elements.

16. An electrical device comprising an optoelectronic component comprising:
an optoelectronic semiconductor chip comprising a carrier substrate, a first and a second side surface facing one another, respectively, and a third and a fourth side surface that intersect the first and second side surfaces, and a first main surface, at which at least one contact area is arranged, said carrier substrate being transparent to the emitted electromagnetic radiation,
a transparent first potting compound directly adjacent to the first side surface;
a reflective potting compound directly adjacent to the second side surface and the carrier substrate and applied directly to the semiconductor chip, and
a converter element on a side of the first side surface, wherein the first potting compound is arranged between the first side surface and the converter element,
wherein the reflective potting compound at least partly adjoins the third and fourth side surfaces and a second main surface, respectively, and is applied directly to the semiconductor chip.

17. The electrical device according to claim 16, further comprising an optical waveguide.

18. The electrical device according to claim 16, wherein the electrical device is a mobile communication device or a display device.

* * * * *